US009733288B2

(12) United States Patent
Stephens et al.

(10) Patent No.: US 9,733,288 B2
(45) Date of Patent: Aug. 15, 2017

(54) APPARATUS AND METHOD FOR DETERMINING A RESONANT FREQUENCY OF AN LC CIRCUIT IN SITU, BY COMPARING VOLTAGE AND CURRENT POLARITY CHANGES

(71) Applicant: Continental Automotive Systems, Inc., Auburn Hills, MI (US)

(72) Inventors: Dennis L. Stephens, Barrington, IL (US); Patrick A. O'Gorman, Escondido, CA (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/874,110

(22) Filed: Oct. 2, 2015

(65) Prior Publication Data

US 2017/0097381 A1    Apr. 6, 2017

(51) Int. Cl.
*G01N 27/00*   (2006.01)
*H01F 27/42*   (2006.01)
*H02J 1/10*    (2006.01)
*G01R 27/02*   (2006.01)
*G01R 25/04*   (2006.01)
*G01R 19/175*  (2006.01)

(52) U.S. Cl.
CPC ........... *G01R 27/02* (2013.01); *G01R 19/175* (2013.01); *G01R 25/04* (2013.01)

(58) Field of Classification Search
CPC ....... G01R 27/02; G01R 19/175; G01R 25/04
USPC ............. 324/71.1, 652; 307/18, 104
See application file for complete search history.

(56) References Cited

U.S. PATENT DOCUMENTS

| 2006/0158041 | A1* | 7/2006 | Caldwell | ............... A47B 57/00 307/116 |
| 2011/0260548 | A1 | 10/2011 | Urano | |
| 2012/0019076 | A1 | 1/2012 | Urano | |
| 2012/0223585 | A1* | 9/2012 | Urano | ................... H02J 5/005 307/104 |

OTHER PUBLICATIONS

Search Report dated Mar. 30, 2016, from corresponding GB Patent Application No. GB1518902.0.

* cited by examiner

*Primary Examiner* — Farhana Hoque (57) ABSTRACT

The resonant frequency of a reactive circuit is determined in situ by determining phase angle differences between an A.C. driving voltage applied to a transformer primary winding and an induced alternating current in the transformer secondary winding. The phase angle is determined indirectly by detecting when the driving voltage applied to the primary changes its polarity and when an induced current in the secondary changes its polarity. The time difference between those polarity changes indicates whether the voltage leads or lags the current or is in phase. A driving voltage frequency is adjusted in real time until the phase angle differences disappear. A duty cycle of the driving signal applied to the primary is also adjusted to change the voltage induced in the secondary winding. The duty cycle is adjusted by changing either a phase of primary driving voltages or the duty cycle of primary driving voltages.

20 Claims, 6 Drawing Sheets

APPARATUS AND METHOD FOR DETERMINING A RESONANT FREQUENCY OF AN LC CIRCUIT IN SITU, BY COMPARING VOLTAGE AND CURRENT POLARITY CHANGES

BACKGROUND

As used herein, an "LC circuit" is an electric circuit consisting of an inductor, represented by the letter L, and a capacitor, represented by the letter C, connected together. Such circuits are also known as resonant circuits, tank circuits, or tuned circuits. They are referred to as "reactive" circuits because both the inductance and capacitance of an LC circuit have a non-resistive impedance that varies with the frequency of a signal applied to the LC circuit.

LC circuits are can be used for generating signals at a particular frequency or picking out a signal at a particular frequency from a more complex signal. They are key components in many electronic devices, particularly radio equipment and are commonly found in oscillators, filters, tuners and signal mixers. They are also used in electronic ignition systems.

An LC circuit is "resonant" at a frequency at which the inductive and capacitive reactances are of equal magnitude and cancel each other. The resonant frequency of an LC circuit is expressed as $\omega_o=1/\sqrt{LC}$ where L is and C is the capacitance and farads.

Because inductive and capacitive reactances cancel each other at the LC circuit's resonant frequency, it is often necessary to determine a particular frequency at which an LC circuit is resonant. Determining a resonant frequency, however, can be difficult, however, because actual inductance and actual capacitance will change between device due to variations in how an inductor and a capacitor are constructed. An apparatus and method for accurately determining the resonant frequency of an LC circuit would be an improvement over the prior art.

DETAILED DESCRIPTION

Figure 1:
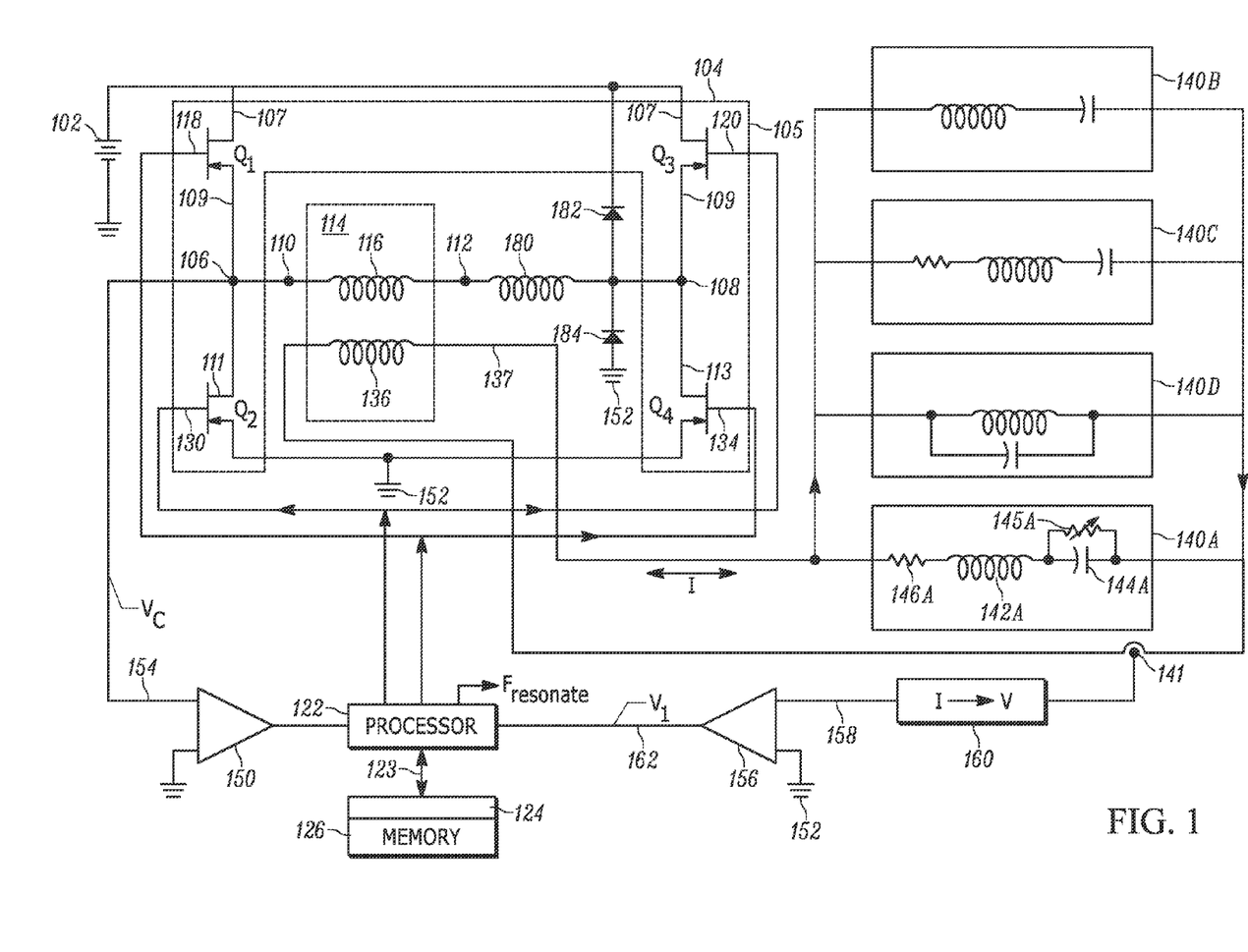
FIG. 1 is a diagram of a device for determining the actual resonant frequency of an LC circuit comprising an inductor in series with a capacitor.

FIG. 1 depicts a preferred embodiment of a device 100 for actively determining the resonant frequency of a LC circuit embodied as an inductor connected in series to a capacitance. The device 100 comprises a battery 102 connected to four field effect transistors (FET) connected to form an H-bridge circuit 105. The H-bridge circuit 105 essentially acts like an electronic double pole, double-throw switch 104.

In FIG. 1, the four transistors Q1-Q4, controlled by a computer 122, are switched on and off in pairs, to control the flow of current through the primary winding 116 of the transformer 114, back and forth. Current through the primary winding 116 thus alternates back and forth, which of course induces an alternating current in the secondary winding 136.

The drains 107 of two FETS, i.e., Q1 and Q3 are both connected to the battery 102, typically a vehicle's twelve-volt storage battery, but can also be any D.C. source of virtually any voltage. The sources 109 of the same two FETS, Q1 and Q3 are connected to the corresponding drains 111, 113 of FETS Q2 and Q4 at two connection points or nodes, denominated as "central nodes," identified in FIG. 1 by reference numerals 106 and 108. Q1 and Q2 are thus considered to be in series with each other as are Q2 and Q4. The series-connected Q1 and Q1 transistors are also considered to be "parallel" to series-connected Q3 and Q4 transistors. First and second opposing ends 110, 112 of the primary winding 116 of a step-up transformer 114 are connected to the central nodes 106 and 108, i.e., the node 106 between Q1 and Q2 and the node 108 between Q3 and Q4.

The paired transistors Q1 and Q4, are controlled by the computer 122 to conduct current together, i.e., at the same time, and are turned "on" at the same time by way of a first control signal, preferably pulses, provided to the gates 118, 134 of those two transistors. The time duration of the control signal pulses provided to both of the transistors' gates 118, 134 by the computer 122 can be changed under the control of executable program instructions 124 stored inside a non-transitory memory device 126 coupled to the computer 122 by a conventional bus 123.

When Q1 and Q4 are turned "on" by the computer 122, a complementary control signal, i.e., a control signal having a polarity opposite to the one provided to Q2 and Q3, is provided by the computer 122 to the gates 130, 120 of the second pair of transistors, Q2 and Q3 in order to turn them off. The first pair of transistors, Q1/Q4 are thus "on" when the second pair of transistors Q2/Q3 are "off" and vice versa.

Q2 and Q3 are considered herein to be turned on and off by a second and different signal provided to the gates 130 and 120 of transistors Q2 and Q3 respectively in order to turn Q2 and Q3 on and off at the same time.

When Q1 and Q4 are "on" and Q2 and Q3 are "off" voltage from the battery 102 is applied to the first end 110 of the primary winding 116, which causes current from the battery 102 to flow through Q1 to ground through Q4. When Q1 and Q4 are "off" Q2 and Q3 are turned "on" the battery voltage is removed from the first end 110 of the primary winding 116 and the same battery voltage applied to the opposite second end 112 of the primary winding 116, causing current to flow from the battery 102 through Q3 to ground through Q2. The switch 104, i.e. the four transistors comprising an H-bridge, are thus "configured" to alternately connect the battery 102, or some other voltage source, to a first end 110 of the primary 116, allow current to flow from the voltage source or battery 102 through the primary winding 116 in a first direction. After a predetermined time has elapsed, transistors Q1 and Q4 are shut off and transistors Q2 and Q3 are turned on, causing the battery 102 to be disconnected from the first end 110 and reconnected to the second end 112 of the primary winding 116, which causes current to flow through the primary winding 116 in an opposite second direction. The battery 102 thus provides current to the primary winding 116, the direction of the current alternating with the switching frequency of the transistors.

Turning the two pairs of transistors Q1/Q4 and Q2/Q3 on and off alternately and periodically, applies a square wave voltage, provided by the battery 102, to opposite ends 110, 112 of the primary winding 116. Alternatingly connecting the battery 102 to the first end 110 of the primary winding 116 and a short time later connecting the battery to the second end 112 of the primary winding 116 causes current from the battery 102 to flow back and forth, through the primary winding 116 of the transformer, periodically. By virtue of the inductive coupling between the windings 116, 136, an alternating current (A.C.), i, that flows through the primary winding 116 induces a corresponding alternating current (A.C.) I, in the secondary winding 136, which is coupled to one or more reactive circuits, four different topologies of which are shown in FIG. 1 and identified by reference numerals 140A-140D.

An optional inductor 180, wired in series with the primary winding 116 and two voltage clamping diodes 182, 184 shunt voltage spikes to either the battery 102 or to a reference potential 152 and enable current through the primary winding 116 to increase and decrease smoothly. The inductor 180 and diodes 182, 184 thus provide a "soft start."

Referring now to the secondary winding 136 of the transformer 114 and the circuitry connected to it, in FIG. 1, a first end 137 of the secondary winding 136 is connected to a reactive circuit 140A, which is connected in series with a current sensor 141. An alternating electric current, I, induced in the secondary winding 136 of the transformer 114 will thus flow through the reactive circuit 140A. The current inducted in the secondary winding 136 and will be impeded by only a resistive or ohmic loss (resistance) 146A associated with every electrical conductor when the frequency of the alternating current, I, happens to be the resonant frequency of the inductor 142A and capacitance 144A. FIG. 1 shows four different reactive circuit topologies 140. Depending on the particular application of the reactive circuits 140A-140D, the capacitance 144A can have a small-valued, frequency-dependent resistance 147A in parallel with the capacitance. The circuitry described herein can be used to determine resonant frequencies of various different reactive circuit topologies shown in FIG. 1 and identified by reference numerals 140A-140D. Those circuit topologies represent reactive circuits that can include fluorescent bulbs, oscillators commonly used in audio and radio communications equipment, and room air filters that ionize air-borne particles.

Those of ordinary skill in the art will recognize that for various reasons, it can be important to drive a reactive circuit at its resonant frequency. Determining the resonant frequency of the reactive circuit 140A is accomplished by adjusting the frequency or rate at which the switch 104 connects the battery 102 to the primary winding 116 of the transformer 114 until the A.C. voltage impressed on the primary winding 116 is exactly in phase with current, I, flowing through the reactive circuit 140.

Determining when the voltage applied to the primary winding 110, and the current flowing through the secondary winding 136 and reactive circuit 140 and are in phase, is accomplished by measuring when each of them, i.e., the primary voltage and secondary current, changes polarity from negative to positive or "crosses zero" and then determining the elapsed time between those two events, if any. Stated another way, when a voltage applied to first end 110 of the primary winding 116 transitions from zero to a positive value or "crosses zero" at precisely the same time that current I, flowing through the secondary winding 136 and reactive circuit 140A connected to the secondary winding 136 also "crosses zero," the primary winding voltage and secondary winding current are "in phase" with each other. The frequency at which those two signals are in phase is the resonant frequency of the reactive circuit 140A.

As used herein, "comparator" refers to an amplifier with two inputs, typically labeled positive and negative, typically with very high input impedances. Such an amplifier usually has very high gain and produces an output signal that is the amplified difference of the positive and negative input signals. For all but the smallest differences, the output will be $V_{max}$ or $V_{min}$, which are the most positive and most negative voltages the amplifier can produce on its output. A comparator can thus be used to determine if an input signal is logically above or below a reference voltage.

In FIG. 1, an input of a first voltage comparator 150 is coupled to the central node 106 between Q1 and Q2, which is also coupled to the first input terminal 110 of the primary winding 116. The first comparator 150 thus compares the primary winding voltage to ground or other reference potential 152 and outputs a signal 154 to the processor 122 when the voltage at the first end 110 of the primary winding 116 is greater than zero. Such a signal 154 from the comparator 150 thus indicates when the polarity of the voltage on the first end 110 of the primary winding 116 has changed from being negative or zero to a positive value. The signal output from the first voltage comparator 150 can thus be considered a primary voltage polarity signal. Since the transformer 114 inductively couples the primary winding 116 to the secondary winding 136, the signal output from the first comparator 150 also indicates when the polarity of the voltage across the reactive circuit 140 changes from negative or zero to a positive value.

A second comparator 156 receives a voltage 158 that is output from a current-to-voltage convertor 160, typically embodied as a small-valued resistor, which is in series with the reactive circuit 140A. The voltage 158 that is provided to the second comparator 156 from the current-to-current converter 160 will thus have the same frequency and phase as, and thus represents or "corresponds to" the load current, I, flowing through the secondary winding 136 and the reactive circuit 140.

The second comparator 156 compares the voltage that represents current, I, through the reactive circuit 140A, to ground or other reference potential 152. The second comparator 156 outputs a voltage 162 as $V_i$ to the processor 122 when the polarity of the voltage 158 representing current, I through the reactive circuit 140 changes its polarity. The signal that is output of the second comparator 156 indicates the direction or polarity of the current flowing through the secondary and can thus be considered a current polarity signal.

Program instructions 124 stored in the memory device 126 cause the processor 122 to measure the time between the processor's 22 receipts of signals from the two comparators 150 and 156. If a time difference exists between the occurrence of the two signals from the comparators 150, 156, the voltage on the primary winding 110 (as well as the voltage across the reactive circuit 140A) and current I, flowing through the secondary winding 136 and reactive circuit 140, are out of phase with respect to each other; the frequency or rate at which the transistors Q1-Q4 are switching the battery voltage across the primary winding 110 is therefore not at the resonant frequency of the reactive circuit 140. The switching frequency can thus be adjusted, up or down, in order to align the phase of the applied voltage, to the current flowing through the secondary winding 136 and the reactive circuit 140A.

Those of ordinary skill in the electrical arts know that when current flowing through a reactive circuit follows or "lags" an applied driving voltage, the frequency of the applied driving signal is greater than the reactive circuits' resonant frequency. Conversely, when current flows through a reactive circuit prior to an applied driving voltage, the current is said to precede or "lead" the voltage due to the fact that the applied driving frequency is below the resonant frequency. When a voltage applied to a reactive circuit increases at the same time that a current increases, the reactive impedance of the circuit's inductance and the reactive impedance of the circuit's capacitance are the same, effectively cancelling each other, which happens when the frequency of the driving signal is equal to the reactive circuits' resonant frequency.

As used herein, "real time" refers to the actual time during which something takes place.

In FIG. 1, program instructions 124 stored in the memory device 126 cause the processor 122 to receive and determine in real time, the arrival time of the signal 154 output from the first voltage comparator 150 relative to the arrival time of the second signal 162 from the second voltage comparator 156. By recording when signals from the comparators arrive, the processor 122 determines whether voltage on the primary winding changes its polarity before or after, i.e., current through the secondary changes its polarity, i.e, the current is determined as leading, lagging or in phase with, the primary winding voltage.

By measuring the time of occurrence of the signals output from the comparators 150. 156 in real time, the processor 122 determines in real time whether voltage on the primary winding 110 changes its state or polarity before or after the current, I, through the reactive circuit 140 changes its state or polarity. The processor 122 thus determines in real time whether the voltage on the primary winding 110 leads, lags or is in phase with current through the reactive circuit 140, e.g., a fluorescent tube, and if necessary adjusts, i.e., changes, the switching frequency of Q1-Q4 in real time until the outputs of the comparators change state at the same time or essentially the same time.

Using the method and apparatus described herein, the resonant frequency of actual components in a reactive circuit 140 can be determined in situ, in real time by a processor. The processor-determined resonant frequency can be provided by the processor 122 as an output signal, $f_{resonant}$, to other devices, such as a device that determines the magnitude of the voltage provided to the primary winding 114 in order to control the intensity of a signal output from a radio frequency transmitter's final amplifier.

As used herein, determining the resonant frequency of a reactive circuit in situ is considered to be determining the resonant frequency of a reactive circuit, such as a series-connected inductor and capacitor, while the reactive circuit component are in place in a circuit, i.e., while the components of the reactive circuit are connected with other circuitry and/or devices as part of a larger system, and not by itself.

Figure 2A:
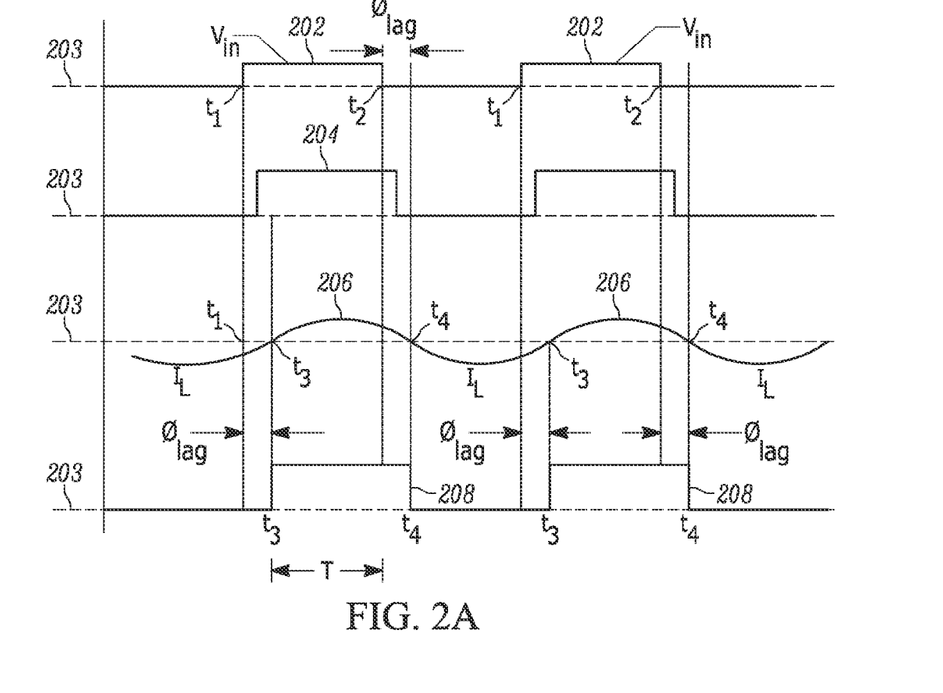
FIG. 2A depicts a voltage applied to an inductor, which is considered to "lead" the current flowing through an LC circuit.
Figure 2B:
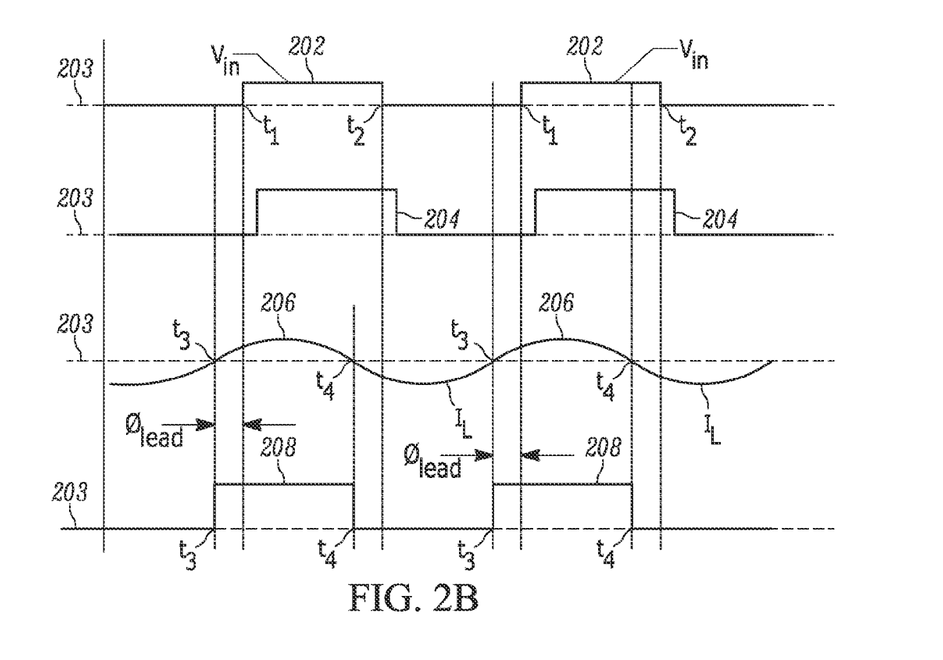
FIG. 2B depicts a voltage applied to an inductor, which is considered to "lag" the current flowing through an LC circuit.
Figure 2C:
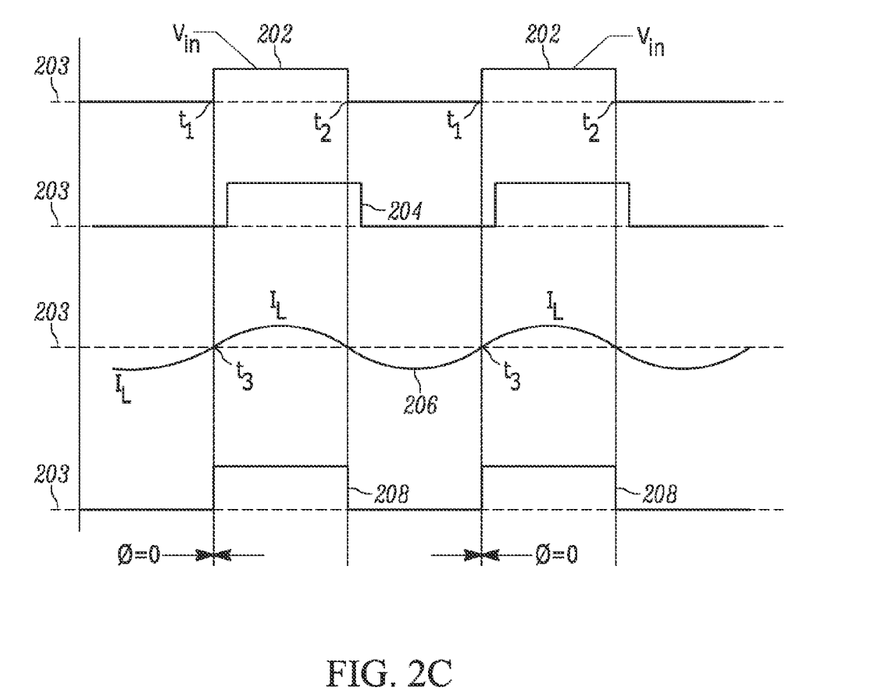
FIG. 2C depicts a voltage applied to an inductor, which is in phase with the current flowing through an LC circuit.

FIGS. 2A, 2B and 2C illustrate how the signals from comparators are used to determine phase difference, if any, between primary winding voltage and secondary winding current.

In FIG. 2A a square wave voltage signal 202 is applied to the primary winding 116 of the transformer 114 by controllably switching the transistors, Q1/Q4 and Q2/Q3, on and off, alternately and periodically, at a rate that is preferably close to but not likely to be equal to the resonant frequency, $\omega_o$, of the reactive circuit 140. The square wave pulses are considered herein to be a driving signal or $V_{in}$.

When the driving signal 202 or $V_{in}$ crosses the X axis, i.e., becomes greater than "zero" volts 203 at time, $t_1$, and thus becomes positive relative to the reference potential 152, the output of the first comparator 150, as represented by the second square wave form 204, goes high or logic one, a short time later.

As shown in FIG. 1, the output 154 of the first comparator 150 as represented by the second waveform 204, is provided to the processor 122, which indicates or signals to the processor 122 that the polarity of the driving voltage on the primary winding 110 changed its state. The output signal 154 of the first comparator 150 will of course stay high until the driving signal 202 goes to zero volts 203 or below zero volts 203 at a later time t2, the time between t1 and t2 being one-half the period of the frequency at which the primary winding 114 is driven.

In FIG. 2A, the second signal 206, which is sinusoidal, represents current, I, flowing through the secondary winding 136 as well as the reactive circuit 140 attached to the secondary winding. The current waveform 206 is drawn to show that the current 206 flows after or later in time and thus follows or "lags" the voltage wave 202 by a phase angle, $\Phi_{lag}$. The polarity of the current, I, flowing through the secondary winding 136 and the reactive circuit 140 crosses the horizontal or X axis, i.e. goes above zero volts 203 or changes its polarity, at t3. The fourth wave form 208, represents the output of the second comparator 156 that is provided to the processor 122. It goes high or true when the polarity of the current I, crosses zero or becomes positive. The time difference between t1 and t3 is the time delay between the voltage, $V_{in}$, applied to the primary winding and current, I flowing through the reactive circuit 140. FIG. 2A thus illustrates a voltage driving signal 202 that "leads" the current signal 206 by a time equal to the time between t1 and t3.

A phase angle difference, $\Phi_{lag}$, between the voltage driving signal 202 and the current 206 can be determined by calculating the elapsed time between t1 and t3 and dividing that time difference it by the time, T of the period or the frequency of the driving signal.

FIF. 2B illustrates the same square wave driving signal 202 at a frequency below the resonant frequency of the reactive load circuit 140. The polarity of the driving signal 202 changes at a time $t_1$, which is "after" or later than the time t3 that current flowing through the reactive load circuit 140 changes its polarity, i.e., crosses the X-axis or zero-volt reference 203. The output 154 of the first voltage comparator 150 thus goes high or changes state after the output 162 of the second voltage comparator 156. In FIG. 2B, the driving voltage, $V_{in}$ is said to follow or "lag" the current, I, flowing through the secondary winding 136 and the reactive circuit 140. Stated another way, the load current I is said to "lead" the driving voltage $V_{in}$ by a phase angle, $\Phi_{lead}$.

Referring now to FIG. 2C, the driving voltage 202 and the load current I 206 are "in phase" with each other. The angle between them, $\Phi$, is zero. When the frequency or rate at which Q1/Q4 and Q2/Q3 apply battery voltage to the primary winding 110, is at the resonant frequency of the reactive LC circuit 140, the outputs of the comparators, considered to be "voltage polarity determiners," will change state at the same t3.

In the preferred embodiment, the processor 122 and the program instructions 124 stored in the memory device 126 determine phase angle differences by measuring the time between when the voltage on the primary winding changes its polarity, relative to the time at which current through the reactive circuit 140 changes its polarity. Depending upon those time differences, the processor 122 increases, decreases or maintains the rate at which the transistors Q1/Q4 and Q2/Q3 open and close. The processor 122 thus sends control signals to the various transistors, Q1-Q4 causing them to change the rate or frequency at which they connect the battery 102 to the primary windings, effectively changing the frequency at which the primary winding 110 of the transformer 114 is driven.

Figure 3:
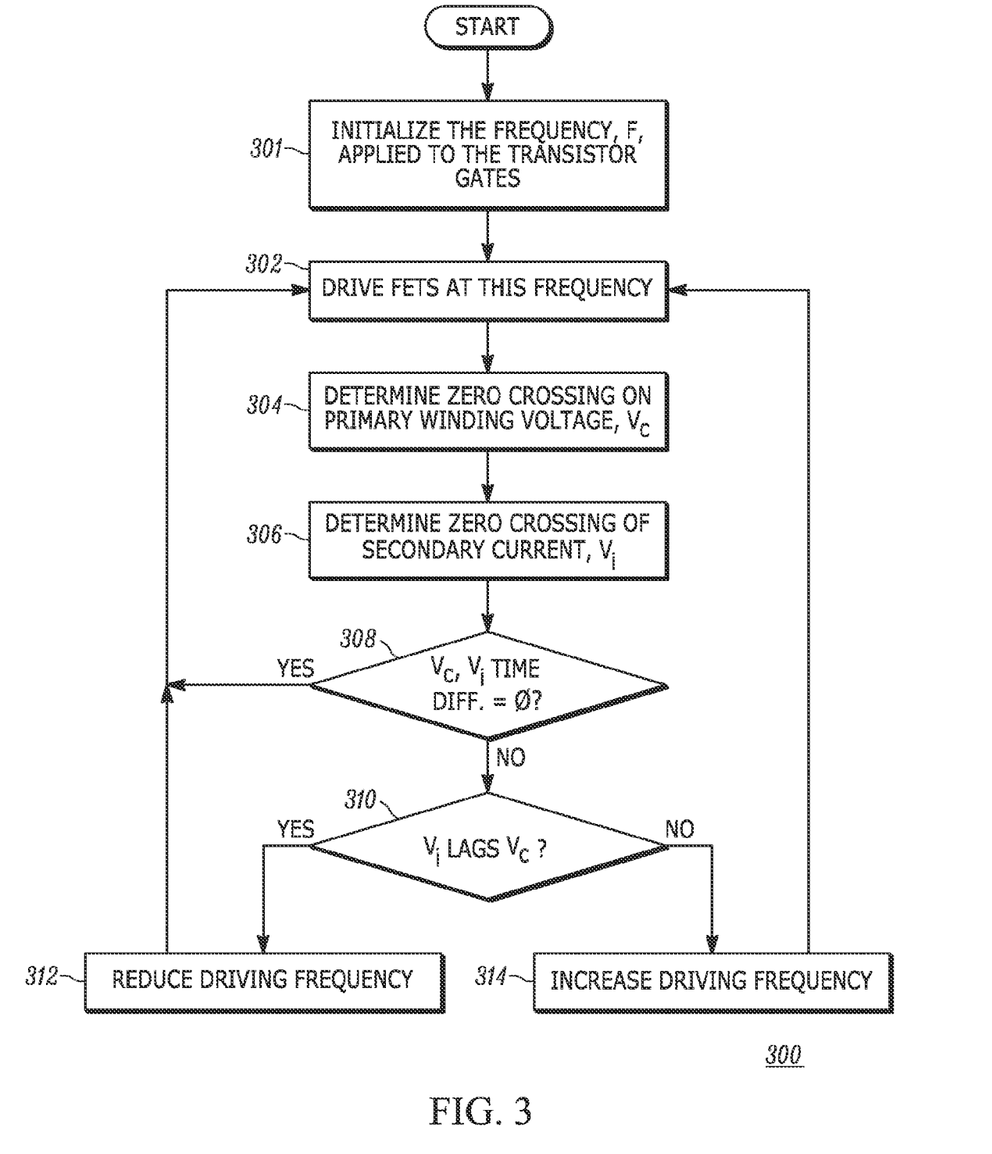
FIG. 3 depicts a method of determining a resonant frequency of an LC circuit.

FIG. 3 depicts steps of a method 300 for determining the resonant frequency of a reactive circuit, typically an LC circuit, by controllably changing the frequency used to drive such a circuit until the voltage applied to the circuit and the current passing through it are in phase. At a first step 301 a driving voltage frequency is chosen and pulses applied to the gates of the transistors that apply battery voltage to the primary winding of a transformer such as the one shown in FIG. 1.

In steps 304 and 306, the "zero crossings" of the voltage on the primary winding 110 and current, I, flowing through the reactive circuit 140 connected to the transformer's secondary winding 136 are preferably determined using polarity determiners embodied as analog voltage comparators.

In step 308, the relative time of occurrence of the zero crossings, as determined by the comparators 150, 156, are compared to each other by the processor 122. If at step 308 the voltage on the primary winding 114 and the current through the secondary winding 136 are in phase relative to each other, in which case the outputs of the comparators 150, 156 will go true or high at the same time or substantially the same time, the frequency of the driving voltage applied to the primary winding 116 is equal to, or substantially equal to the resonant frequency of a reactive device connected to the secondary winding 136. The transistors can thus be "driven" or switched on and off at th particular frequency.

If at step 308, the zero crossings are not simultaneous the current through the secondary winding and voltage on the primary winding are not in phase. The method 300 thus proceeds from step 308 to step 310 whereat a determination is made whether current through the secondary winding 136 lags or leads voltage on the primary winding 116, as measured by the first comparator 150 at the first node 106.

If current through the secondary winding lags behind voltage on the primary winding, the driving frequency is increased incrementally at step 312. Steps 302, 304, 306 and 308 are then repeated until current and voltage are in phase. If on the other hand current through the secondary leads the voltage on the primary, the frequency of the driving signal applied to the transistor gates is reduced. Steps 302, 304, 306 and 308 are then repeated until current and voltage are in phase.

Those of ordinary skill in the art should recognize that by using the apparatus and method described herein, the resonant frequency of any reactive circuit can be precisely determined in real time, in situ, by measuring polarity changes of voltages and currents and measuring the time between those polarity changes. In the preferred embodiment the processor 122, its memory 126 the instructions 124 stored therein comprise a phase angle determiner, which is capable of determining both positive and negative phase angle differences between the voltage and current and adjusting the frequency at which the transistors Q-Q4 are turned on and off until the voltage and current in phase with each other.

Those of ordinary skill in the art should also recognize that the functionality of the processor 122 can be replicated by discrete analog and digital devices. An alternate and equivalent embodiment of a phase angle determiner measures the time between the signals output from the comparators using digital counters and a digital comparator in order to provide a digital representation of the time between the comparator output signals.

Digital representations of the time differential are converted to an analog value using a conventional digital to analog converter or D/A, the output of which is provided to a voltage controlled oscillator configured to provide a square wave control signal to the gates of the transistors Q1-Q4 as described above. A processor 122, however, makes it very easy to adjust both the frequency, phasing as well as the time duration or duty cycle of the pulses provided to the transistor gates.

Changing the duration or duty cycle of the pulses provided to the transistor gates will change the "duty cycle" of the voltage that is alternately applied to the primary winding 116. Changing the duty cycle of the voltage applied to the primary winding 110 effectively changes the average of the voltage applied to the primary winding 110, which will of course change the magnitude of the voltage induced in the secondary winding 136. Changing the secondary winding voltage magnitude will also of course change the magnitude of the current flowing through the secondary winding.

Figure 4A:
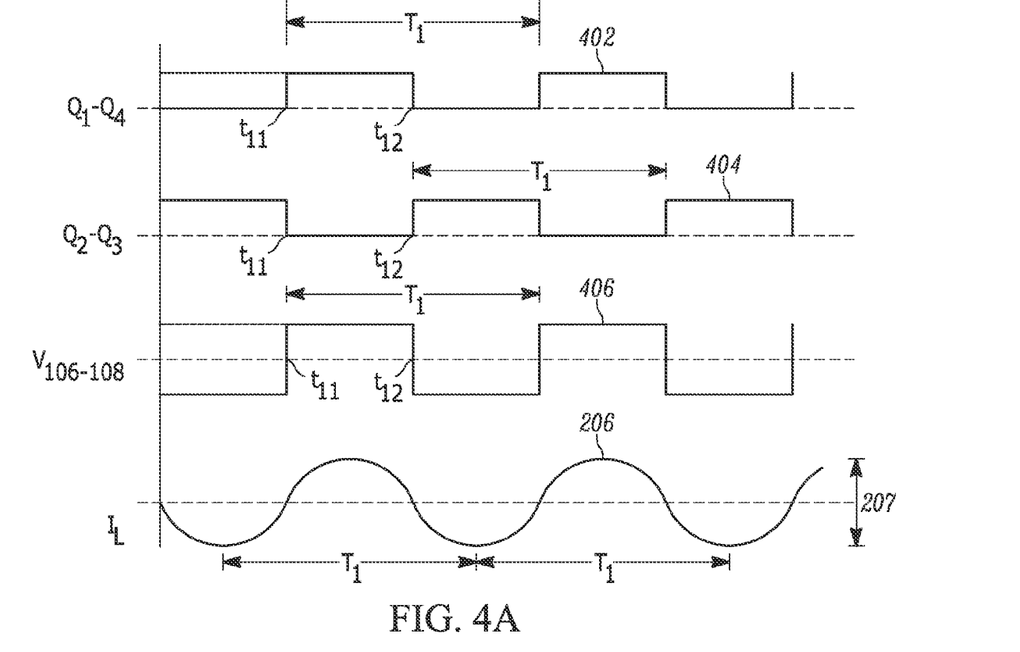
FIGS. 4A and 4B depict timing diagrams of control voltages that determine duty cycles of transistor on and off times by controlling the phases of gate control voltages relative to each other.
Figure 4B:
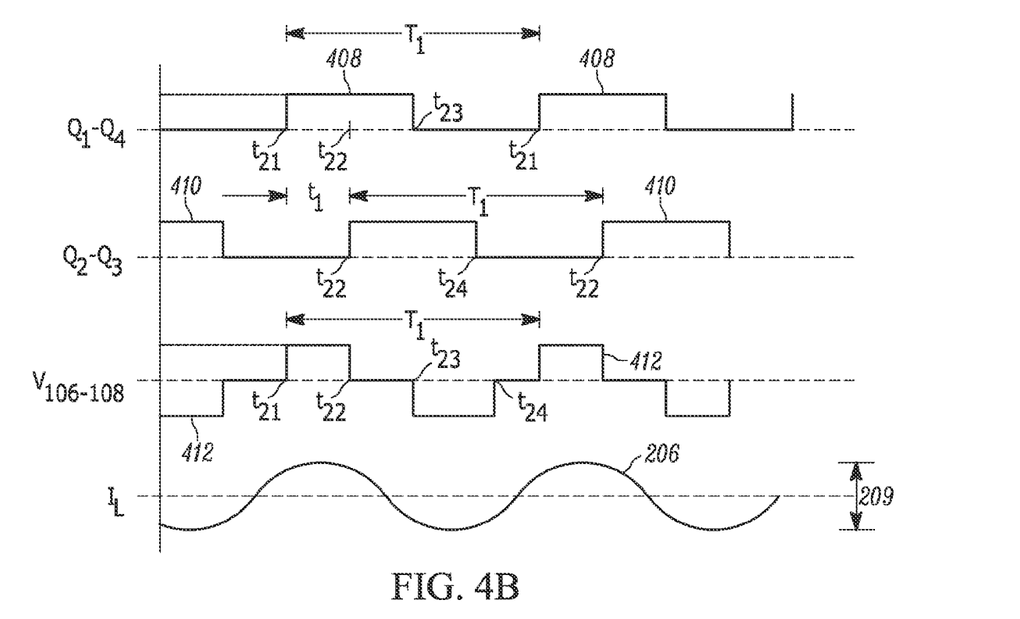

As shown in FIGS. 4A and 4B, changing the phase the driving voltages applied to the gates of the transistor pairs Q1/Q4 and Q2/Q3 relative to each other, will change the duty cycle of the voltage applied to the primary winding 110 by the transistors and change the magnitude of the voltage induced (generated) at the secondary winding 136 and change the magnitude of the induced current. The phases of the driving voltages applied to the gate terminals can thus be adjusted under software control, i.e., by the processor 122, to obtain a particular voltage across or current through the secondary winding.

As used herein, the term, "duty cycle" refers to the ratio between the time that a transistor pair Q1/Q4 and Q2/Q3 is on and the time that the transistor pair is off.

In FIG. 4A, a square wave control signal 402 having a time period T1 is applied by the processor 122 to the gates 118, 134 of the transistors Q1/Q4. The control signal 402 from the processor 102 turns on transistors Q1/Q4 for the same amount of time that they are off. The processor 122 thus controls the transistors Q1/Q4 so that they have a fifty-percent (50%) on/off duty cycle.

A second square wave control signal 404 from the processor 122 is applied to the gates of transistors Q2/Q3, and which is the complement or inverse of the square wave control signal 402 applied to transistors Q1/Q4, turns on transistors Q2/Q3 when Q1/Q4 are "off," and for the same amount of time that they Q1/Q3 are "on." The processor 122 thus controls the transistors Q2/Q3 so that they also have a fifty-percent (50%) duty cycle. The period of the gate control signals 402 and 404, is denominated as T1. Alternately turning on the paired transistors Q1/Q4 and Q2/Q3 effectively generates an alternating voltage across the primary winding of the transformer.

Referring now to FIG. 1, those of ordinary skill in the art should recognize that when the first pair of transistors Q1/Q4 is "on" and second pair of transistors Q2/Q3 is "off," the voltage provided by the battery 102 is applied to the first central node 106 of the circuit 100 while the second central node 108 is at the reference potential 152, typically ground. When Q1/Q4 are on and Q2/Q3 are off, the voltage, $V_{106-108}$ at $t_1$ is thus equal to the battery voltage.

When the first pair of transistors Q1/Q4 is "off" and second pair of transistors Q2/Q3 is "on," the voltage provided by the battery 102 is applied to the second central node 108 of the circuit 100 while the first central node 106 is at the reference potential 152. When Q1/Q4 are off and Q2/Q3 are on, the voltage, $V_{106-108}$ at $t_1$ is thus equal to the battery voltage.

Nodes 106 and 108 are respectively connected to the first and second ends of the primary winding 116. Alternately applying the battery voltage to nodes 106 and 108 thus induces a bi-polar voltage across the primary winding 116, which is depicted in FIG. 4 as a square wave signal identified by reference numeral 406.

Referring again to FIG. 4A, when $t=t_{11}$, the voltage across the primary winding, $V_{106-108}$, is "positive" because Q1/Q4 apply the battery voltage to node 106. $V_{106-108}$ stays positive until $t=t_{12}$ at which time $V_{106-108}$ goes "negative" because Q1/Q4 are turned off, Q2/Q3 are turned on, which removes the battery voltage from node 106 and applies the battery voltage instead to node 108. The square wave voltage across the primary winding, i.e., $V_{106-108}$, has a period equal to T1. The current through the secondary winding, represented by the sinusoidal signal identified by reference numeral 206 has a magnitude identified by reference numeral 207 and a period equal to T1.

In FIG. 4B, at $t=t21$, a square wave control signal 408 is applied by the processor 122 to the gates of the transistors Q1/Q4, which turns on Q1/Q4. A short time later at $t=t_{22}$, and before Q1/Q4 are turned off, i.e., while Q1/Q4 are still "on," a square wave signal 410 is applied to the gates of transistors Q2/Q3 by the processor 122. The control signal 410 applied to the gates of Q1/Q3 at $t=t_{22}$ turns on Q2/Q3 but turning them on also eliminates the voltage difference, $V_{106-108}$ between nodes 106 and 108. At $t=t_{22}$, $V_{106-108}$ goes to zero until $t=t_{23}$, when Q1/Q4 are turned off and at which time $V_{106-108}$ goes negative because Q2/Q3 are still on and thus connect the battery voltage to node 108.

In FIG. 4B, the square wave signal identified by reference numeral 412 depicts the voltage across the primary winding, i.e., $V_{106-108}$. When Q1/Q4 and Q2/Q3 are both "on" as shown at $t=t_{22}$, the voltage across the primary winding 116, $V_{106-108}$, is reduced to zero volts and stays at zero volts until Q1/Q4 are turned "off" at $t=t_{23}$.

When the processor 122 turns Q1/Q4 "off" at $t=t_{23}$ and leaves Q2/Q3 "on," the voltage across the primary winding, $V_{106-108}$, changes its polarity, i.e., $V_{106-108}$ goes negative, however, the duration or duty cycle of the voltage pulses applied to the primary winding 116, as FIG. 4B shows, are shortened by adjusting the phase of the control signal applied to Q1/Q3 relative to the control signal applied to Q1/Q4. Stated another way, changing the phase, or on/off time of Q1/Q4 relative to the on/off time of Q2/Q3 changes the duty cycle and hence the average of the voltage applied to the primary winding 116. In FIG. 4B, the current through the secondary winding, represented by the sinusoidal signal identified by reference numeral 206, has a lesser or reduced magnitude that is identified by reference numeral 209. The current through the secondary has a period equal to T1.

Figure 4C:
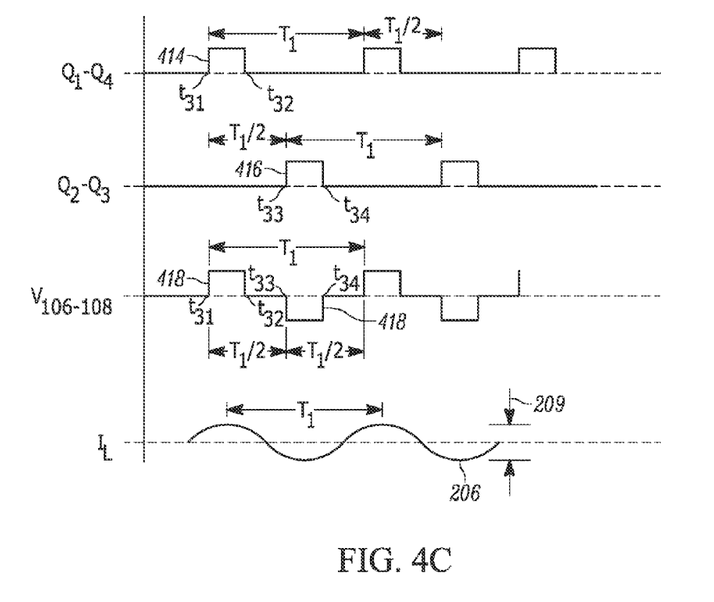
FIG. 4C depicts a timing diagram of control voltages that determine duty cycles of transistor on and off times by controlling the duty cycle of gate control voltages.

Referring now to FIG. 4C, a square wave control signal 414 having the same period T1, is applied to the gates of the transistors Q11/Q4 by the processor 122. Although the control signal 414 has the same period, T1, the "on" time of the control signal 414 depicted in FIG. 4C is much less than its "off" time. The shorter duty-cycle control signal 414 thus turns on transistors Q1/Q4 for a relatively short period of time relative to the time they are off.

A similar control signal 416, having the same period T1 and having the same shortened duty cycle, is applied to the gates of transistors Q2/Q3. The control signal 416 thus turns on Q2/Q3 for a relatively short period of time relative to the time they are off.

In FIG. 4C, the square wave signal identified by reference numeral 418 depicts the voltage across the primary winding, i.e., $V_{106-108}$. When Q1/Q4 are "on," as shown between $t=t_{31}$ and $t=t_{32}$ the voltage across the primary winding, $V_{106-108}$, is positive until Q1/Q4 are turned "off" at $t=t_{32}$, which removes the battery voltage from the primary winding.

At $t=t_{33}$, Q1/Q4 are "off" and Q2/Q3 are turned "on." The duty cycle of the voltage $V_{106-108}$ across the primary winding 116 is thus determined or controlled by the duty cycle of the control voltages applied to the gates of transistors Q1/Q4 and Q2/Q3. In FIG. 4C, the current through the secondary winding, represented by the sinusoidal signal identified by reference numeral 206, has the same reduced magnitude current, which is identified by reference numeral 209 and has a period equal to T1.

Those of ordinary skill in the art should appreciate that, changing the duty cycle or pulse widths of control signals provided to the primary winding 116 will change the magnitude of the voltage induced in the secondary winding 136 of the transformer 114. A phase angle determiner embodied as a processor 122 thus facilitates changing the duty cycle of the primary voltage and thus facilitates changing the magnitude of the voltage induced at a reactive device. In that regard, the voltage provided to the H-bridge transistors from the battery can also be boosted or divided in order to increase or decrease the voltage output from the transformer secondary winding. The forgoing description is for purposes of illustration only. The true scope of the invention is set forth in the following claims.

What is claimed is:

1. A device for determining a resonant frequency of a reactive circuit, the device comprising:

a transformer having a primary coil and a secondary coil, the primary coil having first and second input terminals, the secondary coil having first and second output terminals, at least one of which is configured to be coupled in series with a reactive circuit;

a voltage source configured to provide an alternating current (A.C.) to the primary coil of the transformer;

a voltage polarity determiner coupled to the primary coil;

a current polarity determiner, coupled to the reactive circuit;

a high-speed, multi-pole switch (switch) coupled to the voltage source and to the first and second terminals of the primary coil, the switch being configured to periodically connect the voltage source to the first input terminal at a frequency and alternately connect the voltage source to the second input terminal at the same frequency; and a phase angle determiner coupled to: the switch, the voltage polarity determiner and the current polarity determiner, the phase angle determiner being configured to receive a voltage polarity signal and receive a current polarity signal and determine therefrom, a time between when voltage applied between the terminals of the primary coil and current passing through the reactive circuit change polarity, the phase angle determiner being additionally configured to change the frequency at which the voltage source is connected to the first and second input terminals responsive to whether voltage on the primary coil leads or lags voltage flowing through the reactive circuit, said frequency being changed to eliminate a phase angle difference between voltage applied between the terminals of the primary coil and current through the reactive circuit.

2. The device of claim 1,
wherein the voltage polarity determiner comprises a first voltage comparator coupled to the primary winding and to a reference potential, the first comparator configured to determine when voltage on the primary coil changes its polarity relative to the reference potential; and
wherein the current polarity determiner comprises a second comparator configured to determine when current flowing through the reactive circuit changes its polarity relative to the reference potential, and
wherein the phase angle determiner is configured to receive signals from the first and second comparators and determine whether the current through the reactive circuit leads or lags voltage across the reactive circuit.

3. The device of claim 2, wherein the phase angle determiner is configured to determine a phase angle difference between voltage on the primary winding and current through the reactive circuit by determining an elapsed time between when voltage on the primary coil changes its polarity and current flowing through the reactive circuit changes its polarity.

4. The device of claim 1, wherein the voltage source is obtained from a battery.

5. The device of claim 1, wherein the voltage source comprises a battery and wherein the phase angle determiner is configured to adjust a duty cycle of the battery voltage applied to the primary winding responsive to a magnitude of a voltage output from the secondary winding.

6. The device of claim 1, wherein the phase angle determiner comprises a computer and an associated memory device, the memory device storing program instructions, which when executed by the computer cause the computer to receive the voltage polarity signal and the current polarity signal and determine a phase angle between them, the computer being additionally configured to send control signals to the switch, the control signal to the switch changing the frequency at which the voltage source is coupled to the first and second input terminals, the frequency being changed by the program instructions in order to reduce a phase angle difference between voltage on the primary and current through the reactive circuit.

7. The device of claim 1, wherein the reactive circuit is an inductance connected in series with a capacitance.

8. The device of claim 7, wherein the capacitance has an associated, frequency-dependent parallel resistance.

9. The device of claim 1, wherein the reactive circuit is an inductance connected in parallel with a capacitance.

10. The device of claim 1, wherein the high-speed, multi-pole switch comprises at least four transistors connected to form an H-bridge having first and second parallel legs, the first leg and second legs comprising first and second transistors connected in series to each other at a central node, the central node of the first leg being connected to the first input of the primary coil, the central node of the second leg being connected to the second input of the primary coil.

11. The device of claim 1, wherein the voltage polarity determiner comprises a first voltage comparator configured to detect a zero crossing of voltage signals on one of the first and second input terminals.

12. The device of claim 1, wherein the current polarity determiner comprises a current-to-voltage converter coupled to a second voltage comparator, the current-to-voltage converter and second voltage comparator configured to detect the polarity of current flowing through the reactive circuit responsive to voltage signals provided to the primary coil.

13. The device of claim 1, wherein the phase angle determiner is configured to determine both positive and negative phase angle differences.

14. A method of determining a resonant frequency of a reactive circuit coupled to a secondary winding of a transformer having a primary winding with first and second opposing ends, the method comprising:
connecting an alternating current (A.C.) source at a first frequency to the primary winding;
increasing and decreasing the first frequency, responsive to a determination that voltage on the primary coil leads or lags current flowing through the reactive circuit, said first frequency being changed to eliminate a phase angle difference between voltage on the primary coil and current through the reactive circuit;
determining a phase angle of a voltage on the primary;
determining a phase angle of a current through the reactive circuit;
determining a difference between the phase angle of the voltage and the phase angle of the current; and
changing the frequency of the A.C. source to reduce the phase angle difference.

15. The method of claim 14, wherein the A.C. source is a square wave signal.

16. The method of claim 14, further comprising: determining a phase angle of voltage applied to the primary winding and determining a phase angle of current passing through the reactive circuit.

17. The method of claim 14, wherein voltage induced in the secondary winding has magnitude, the method further comprising changing the magnitude of a voltage induced in the secondary winding by adjusting a duty cycle of the A.C. source provided to the primary winding.

18. The method of claim 17, wherein adjusting the duty cycle of the A.C. source provided to the primary winding comprises changing a relative phase of voltages applied to the first and second opposing ends of the primary winding.

19. The method of claim 17, wherein adjusting the duty cycle of the A.C. source provided to the primary winding comprises change a duty cycle of voltages applied to the first and second opposing ends of the primary winding.

20. A method of determining a resonant frequency of a reactive circuit coupled to a secondary winding of a transformer having a primary winding with first and second opposing ends, the method comprising:
connecting an alternating current (A.C.) source at a first frequency to the primary winding; and
increasing and decreasing the first frequency, responsive to a determination that voltage on the primary coil leads or lags current flowing through the reactive circuit, said first frequency being changed to eliminate a phase angle difference between voltage on the primary coil and current through the reactive circuit;
wherein the step of connecting an A.C. source to primary winding comprises attaching an H-bridge circuit having first and second parallel legs to first and second opposing ends of the primary winding, the first leg and second legs comprising first and second transistors connected in series to each other at a central node, the central node of the first leg being connected the first end of the primary coil, the central node of the second leg being connected to the second end of the primary coil.

* * * * *